United States Patent [19]

Jeng et al.

[11] Patent Number: 5,710,073

[45] Date of Patent: Jan. 20, 1998

[54] METHOD FOR FORMING INTERCONNECTIONS AND CONDUCTORS FOR HIGH DENSITY INTEGRATED CIRCUITS

[75] Inventors: Erik S. Jeng, Taipei; Ing-Ruey Liaw, Hsinchu, both of Taiwan

[73] Assignee: Vanguard International Semiconductor Corporation, Hsin-chu, Taiwan

[21] Appl. No.: 585,614

[22] Filed: Jan. 16, 1996

[51] Int. Cl.⁶ .................................. H01L 21/8242
[52] U.S. Cl. .................... 438/239; 438/240; 438/210; 438/253; 438/256; 438/396; 438/399
[58] Field of Search .................... 437/210, 238, 437/239, 240, 253, 254, 256, 396, 399

[56] References Cited

U.S. PATENT DOCUMENTS

| | | | |
|---|---|---|---|
| 5,202,275 | 4/1993 | Sugiura et al. | 438/210 |
| 5,248,628 | 9/1993 | Okabe et al. | 438/256 |
| 5,401,681 | 3/1995 | Dennison | 438/398 |
| 5,550,078 | 8/1996 | Sung | 438/210 |
| 5,639,682 | 6/1997 | Choe | 438/396 |

OTHER PUBLICATIONS

"CDVSiNx Anti–Reflective Coating for Sub 0.5 µm Lithography" by T. P. Ong et al, 1995, Symposium on VLSI Technology Digest of Technical Papers P73–74.

"Selective Dry Etching in a High Density Plasma for 0.5 µm Complementary Metal–Oxide–Semiconductor Technology" by J. Givens et al, J. Vac.

"High Selectivity Silicon Nitride Etch for Sub–Half Micron Devices" by Karen Reinhard et al, Lam Research Corp. Taiwan Technical.

*Primary Examiner*—Trung Dang
*Attorney, Agent, or Firm*—George O. Saile; Stephen B. Ackerman; William J. Stoffel

[57] ABSTRACT

The present invention provides a method of manufacturing miniature interconnect for semiconductor devices. The method uses a configuration of spacers and etch barriers (silicon nitride cap layers) to form self aligned source and drain contacts. Antireflective silicon nitride cap layers and highly selective etches are used define smaller interconnect openings. First spacers are formed on the gate electrodes. Later, the second spacers are formed the sidewalls of a storage electrode hole formed in insulation layers over the gate electrodes. The inventive self-aligning process, which uses the two set of spacers, allows a wide processing window for contact etching to form the contact hole and permit a small contact hole aspect ratio. The method reduces the masking steps by defining both the source and drain contacts in the same masking step.

24 Claims, 6 Drawing Sheets

METHOD FOR FORMING INTERCONNECTIONS AND CONDUCTORS FOR HIGH DENSITY INTEGRATED CIRCUITS

BACKGROUND OF INVENTION

1. Field of the Invention

This invention relates generally to the fabrication of high density semiconductor circuits and more particularly to a method for fabricating interconnections and conductors for high density integrated circuits.

2. Description of the Prior Art

Semiconductor technologies have dramatically increased the circuit density on a chip. The miniaturized devices built in and on a semiconductor substrate are very closely spaced and their packing density has increased significantly. More recent advances in photolithographic techniques, such as phase-shifting masks, and self-aligning process steps have further reduced the device sized and increased circuit density. This has lead to ultra large scale integration (ULSI) with minimum device dimensions less than a micrometer and more than a million transistors on a chip. With this improved integration, some circuit elements experience electrical limitations due to their down sizing.

One such circuit element experiencing electrical limitations is the array of storage cells on a dynamic random access memory (DRAM) chip. These individual DRAM storage cells, usually consisting of a single metal-oxide-semiconductor field effect transistor (MOS-FET) and a single capacitor are used extensively in the electronic industry for storing data. A single DRAM cell stores a bit of data on the capacitor as electrical charge. metallization in contact with the semiconductor substrate is called contact metallization. In MOS devices, polysilicon film has been the form of metallization used for gate and interconnection of MOS devices. The inability to further miniaturize the contact metallization and first level interconnections (i.e., MOS on the substrate) is a major obstacle in the miniaturization of DRAMs and other devices, such as MOS and Bipolar devices. Also, the decrease in cell capacitance caused by reduced memory cell area is a serious obstacle to increasing packing density in dynamic random access memories (DRAMs). Thus, the problems forming smaller first level contacts and first level interconnections and the problems of decreased cell capacitance must be solved to achieve higher packing density in a semiconductor memory devices.

The following articles show related processes: "CVD SiNx Anti-Reflective Coating for Sub-0.5 µm Lithography", by T. P. Ong et al., 1995 Symposium on VLSI Technology Digest of Technical papers, (0-7803-2602-4/95) p. 73–74; "Selective dry etching in a high density plasma for 0.5 µm complementary metal-oxide-semiconductor technology", by J. Givens et al., J. Vac. Sci. Technol. B 12(1), Jan/Feb 1994, p. 427–432; and "High Selectivity Silicon Nitride Etch for Sub-Half Micron Devices", by Karen Reinhard et al., Lam Research Corp., Taiwan Technical Symposium, Nov. 15, 1994. However, many of the prior art methods require substantially more processing steps or/and planar structures which make the manufacturing process more complex and costly. Also, other process methods rely on etching to a predetermined etch depth which can be quite difficult to control in a manufacturing environment. For example, during plasma etching outgassing, virtual or real leaks, back streaming from pumps and loading effects, to name a few, can change the chemistry of the etching environment in the process chamber, making a calibrated etch time approach difficult to control. Therefore, it is very desirable to develop processes that are as simple as possible and also provide methods that do not require etches with critical depths.

There is a challenge to develop methods of manufacturing these interconnects and conductors that minimize the manufacturing costs and maximize the device yields. In particular, there is a challenge to develop a method which minimizes the number of photoresist masking operations and to provide maximum process tolerance to maximize product yields. Typically, in DRAM fabrication, two mask/etch steps are performed to form the conductor connection to the bit line and the node contact. Moreover, the conductor contact and node contacts are not self aligned which limits their miniaturization. Moreover, contact holes through thick insulation layer create high aspect ratios (greater than 3) which make the contact etch processes difficult and etch defects reduce yields. There is also a challenge to develop an interconnection process in which the interconnect size is not limited in size by the photolithographic techniques.

SUMMARY OF THE INVENTION

It is an object of the present invention to provide a method for fabricating an integrated circuit having interconnects and contacts that can overcome the size limitations of photographic techniques and that reduces the number of masking steps.

It is an object of the present invention to provide a method for fabricating a integrate circuit having high density contact hole formations and interconnections.

It is an object of the present invention to provide a method for fabricating a dynamic random access memory (DRAM) device having capacitor with a high density and capacitance which is low cost, simple to manufacture, and has large process windows.

To accomplish the above objectives, the present invention provides a new method of manufacturing semiconductor devices having high density first level contacts and first level interconnections. These goals are achieved by the process which: (1) forms isolation caps having anti reflective properties on the tops of the gate electrodes and on top of first level interconnects; (2) uses highly selective silicon nitride etches for defining the isolation caps; and (3) forms self aligned first and second level substrate contacts using isolation spacers on the gate electrodes and on the first level insulation layer.

Briefly, the method of fabricating an interconnect on a semiconductor substrate having a device area and spaced isolation regions formed therein; comprising the steps of providing spaced gate electrodes on the device area and conductive structures on the isolation regions. The gate electrodes and conductive structures have a top surface formed of a first isolation cap layer comprised of an anti reflective silicon nitride film. Next, first isolation spacers composed of silicon nitride are formed on the sidewalls of the gate electrodes and on the sidewalls of the conductive structures. A top isolation layer is formed covering the first isolation cap layer over the gate electrodes. Next, a first polysilicon layer 30, a dielectric layer 26, and a second isolation cap layer are sequentially formed over the substrate surface. A first opening having first sidewalls is formed by masking and selectively etching the second isolation layer and the dielectric layer and etching upper portions of the first polysilicon layer between the gate electrode. Second isolation spacers are formed on the first sidewalls of the first opening. A top node plug is formed filling the first opening and forming a contact to the bottom node plug thereby forming the interconnect to the source.

The process of the current invention has numerous advantages over the prior art. First, the inventive self-aligning process uses the two sets of sidewall spacers that allow a wide processing window for contact etching to form the contact hole. Also, the isolation spacers permit a small contact hole aspect ratio thus miniaturizing the cell beyond lithographic limits. The first and second isolation cap layers having the anti-reflective coating (ARC) improve the lithographic performance by permitting finer contact hole definition. Thirdly, the method reduces the masking steps by defining both the source and drain contacts in the same masking step. Lastly, the highly selective high density plasma etch process improves the accuracy of the contact hole and storage electrode.

DETAILED DESCRIPTION OF THE PREFERRED EMBODIMENTS

The present invention will be described in detail with reference to the accompanying drawings. The present invention provides a method of forming a miniaturized interconnects. Also, the method can be used to formed a memory cell having a capacitor which has small dimensions, high capacitance and is simple to manufacture. First, the processes for forming the field oxide (FOX) and the field effect transistor structure as presently practiced in manufacturing DRAM cells are only briefly described in order to better understand the current invention. Second, the novel method using two sets of spacers and two anti-reflective silicon nitride cap layers to define the interconnect will be described in detail. Also, the term substrate surface is meant to include the top surfaces of layers or structures formed on the semiconductor substrate.

Figure 1:
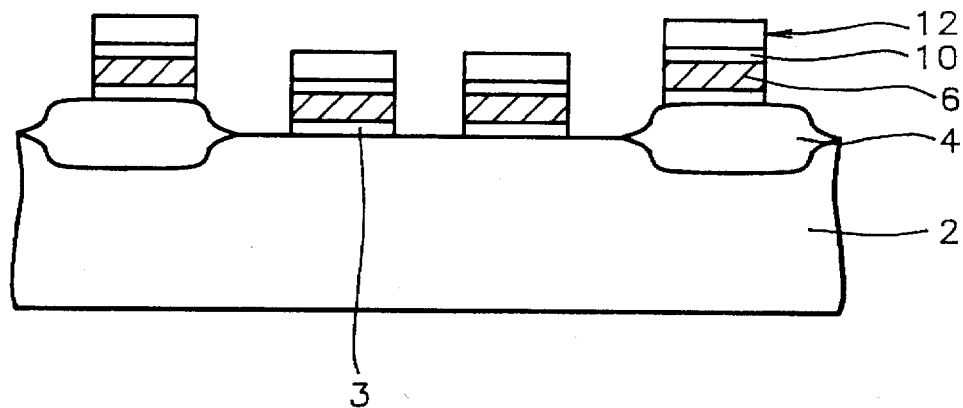
FIGS. 1 through 9 are cross sectional views for illustrating the method for manufacturing a DRAM having a stacked capacitor according to the present invention.

As shown in FIG. 1, the method begins by fabricating a capacitor in a substrate having a isolation region 4 surrounding device areas and FET devices formed thereon. The isolation regions 4, such as field oxide layers 4, are formed on a semiconductor substrate 2 for defining active regions and isolation regions. The preferred substrate is composed of a P-type single crystal silicon having a (100) crystallographic orientation. A relatively thick field oxide (FOX) 4 is formed around the active device areas to electrically isolate these areas. This field oxide preferably is formed by masking the active device areas with a thick silicon oxide (pad oxide) and a thicker silicon nitride layer which forms an oxidation barrier. The silicon substrate is then oxidized in an oxidizing ambient to form the field oxide. The preferred thickness being in the range of about 3000 to 5000 Å.

A semiconductor FET device is then formed in the active device area after removing the silicon nitride barrier layer and the pad oxide with a conventional wet etch. The most commonly used device for a dynamic random access memory (DRAM) is MOSFET. This device is formed by first thermally oxidizing the active device area to form a thin gate oxide layer 3. The preferred thickness being from about 70 to 90 Å.

An appropriately doped polysilicon layer 6 and a gate dielectric layer 10 are deposited on substrate 2. The doped polysilicon layer 6 can include a polycide layer such as tungsten silicide. The gate dielectric layer can be formed of silicon dioxide. The gate dielectric layer 10 preferably has a thickness in the range of between about 200 and 1000 Å.

As shown in FIG. 1, a first isolation cap layer 12 is formed over the gate insulation layer 10. A cap layer (e.g., layers 12 28) is the top layer in a gate or contact structure which is used as an etch barrier. The first isolation cap layer is preferably formed of silicon nitride having an anti-reflective properties. The anti-reflective properties improve lithography resolution by reducing reflectance off the cap layer. The silicon nitride first isolation cap layer can be formed by a LPCVD process by reacting an excess of dichlorosilane with ammonia. The first isolation layer preferably has a thickness in the range of between about 200 and 2000 Å and more preferably about 1000 Å. The layer 12 preferably has an extinction coefficient (k) in range between about 0.3 and 0.5. The LPCVD process preferably uses an excess of dichlorosilane to ammonia with a ratio in the range of between about 1:2 and 1:4 and more preferably about 1:3 and is performed at a pressure preferably in the range of between about 100 and 500 mTorr and more preferably about 400 mTorr; and at a temperature in the range of between about 750° and 850° C. and more preferably about 780° C.

The first isolation cap layer can also be formed of silicon oxy nitride ($SiO_xN_yH$) formed by LPCVD process preferably using TEOS, $SiH_4$, and $NH_3$ reactants with a temperature in the range of between about 750° and 850° C. and a pressure in the range of between about 100 and 500 mTorr. The first isolation cap layer formed of $SiO_xN_yH$ has a thickness preferably in the range of between about 200 and 2000 Å.

Next, photolithographic and etching techniques are used to pattern the gate oxide layer 03, the conductive layer 06, the gate dielectric layer 10, and the first isolation cap layer 12, to form spaced gate electrodes and conductive structures. Conductive structures formed on the field oxide regions can act as a word lines. Gate electrodes are formed on the substrate surface and can be part of the transistor in a DRAM or other devices.

The patterning of the gate electrodes and conductive structures is performed by forming a mask on the first isolation cap layer 12 and etching the underlying layers. An etch with a high SiN to $SiO_2$ selectivity is used to etch the first isolation cap layer 12. The highly selective etch has two steps: a main etch step and an over etch step. The main etch is preferably performed with a pressure in the range of between about 280 and 320 mtorr and a power in the range of between about 250 and 300 watts, and an electrode gap in the range of between about 0.7 and 0.9 cm, and a $SF_6$ flow in the range of between about 60 and 80 sccm, and a $CHF_3$ flow in the range of between about 9 and 11 sccm, and a He flow in the range of between about 240 and 260 sccm. The over etch step is preferably performed with a pressure in the range of between about 725 and 775 mtorr and a power in the range of between about 180 and 200 watts, and a gap in the range of between about 0.9 and 1.1 cm, and a $SF_6$ flow in the range of between about 110 and 130 sccm, and a $CHF_3$ flow in the range of between about 9 and 11 sccm, and a He flow in the range of between about 18 and 22 sccm. The highly selective high density plasma etch process improves the accuracy of the contact hole and allows smaller interconnect dimensions. The gate dielectric layer 10, the conductive layer 6 and the gate oxide layer are then etched using same mask.

The lightly doped source/drain (not shown) of the N-channel MOSFET are preferably formed next, usually by implanting an N-type atomic species such as arsenic or phosphorus through the spaces between the gate electrodes 8 thereby forming lightly doped source and drain. For example, a typical implant might consist of phosphorus P31 at a dose of between about 1E13 to 1E14 atoms/cm² and at an energy between about 30 to 80 Kev.

Figure 2:
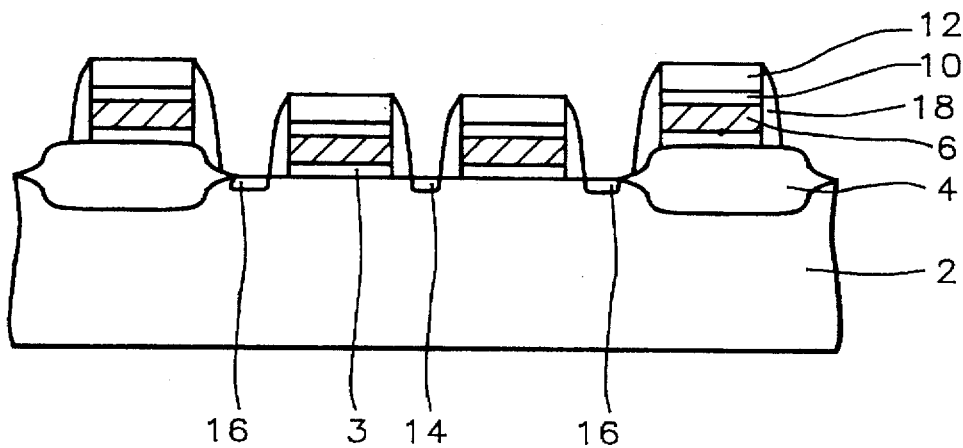

Referring to FIG. 2, after forming the lightly doped source/drain, first isolation spacers 18 are formed on the gate electrode 8 sidewalls. The first isolation spacers 18 are preferable formed of silicon nitride using a LPCVD process. The first isolation layer spacers preferably have a thickness in the range of between about 200 and 1000 Å and more preferably about 500 Å.

The distance between the gate electrodes is preferably in the range of between about 0.25 and 0.4 µm and the distance between the first isolation spacers is preferably in the range of between about 0.2 and 0.35 µm.

The source/drain regions 16 14 of the MOSFET are now implanted between the first isolation spacers 18 with a N type atomic species, for example, arsenic (As75), to complete the highly doped source/drain (i.e., the source is the node contact). The implantation is usually done through a thin layer of silicon oxide of about 200 to 300 Å in thickness to minimize implant channeling and to protect against contamination by metals and other impurities. A typical implantation dose being between 2E15 to 1E16 atoms/cm² and an energy of between about 20 to 70 Kev.

Figure 3A:
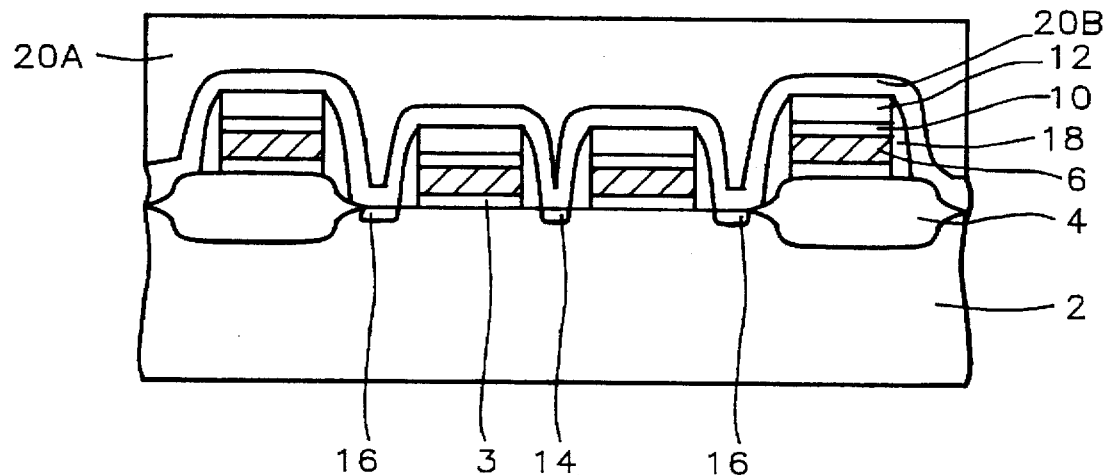
Figure 3B:
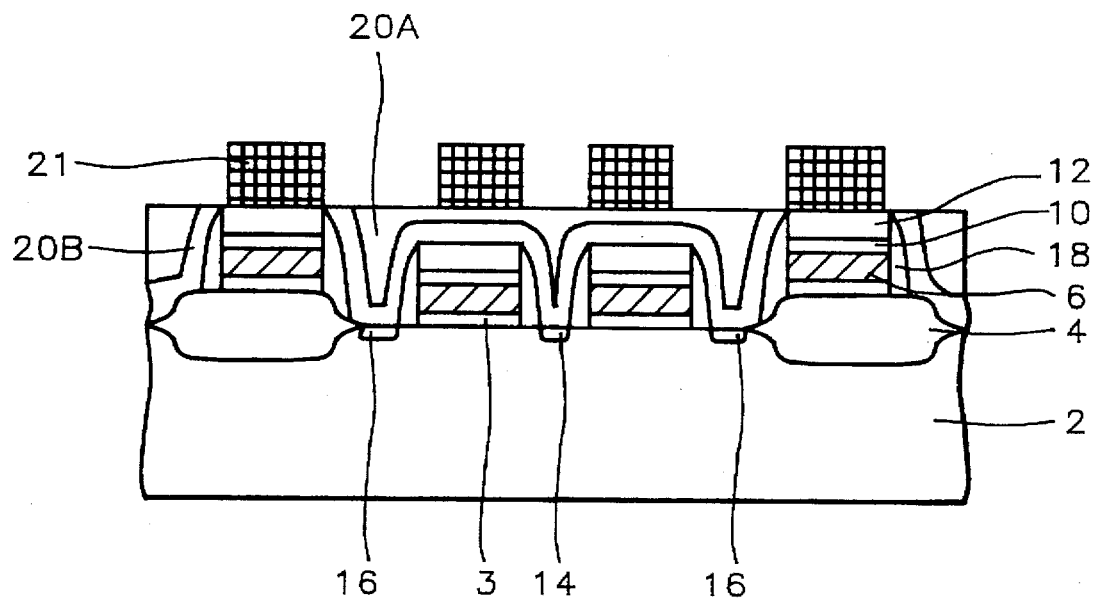
Figure 3C:
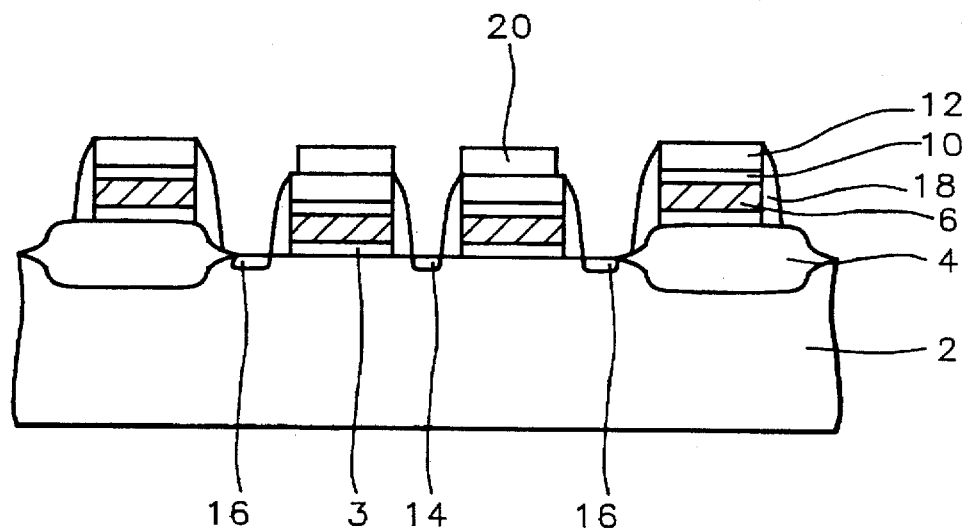

As shown in FIG. 3C, the top of the second gate electrode is covered with a top isolation layer 20. The top isolation layer levels the top surfaces of the gate electrodes and the conductive structures on the field oxide regions 04. The top isolation layer 20 preferably has a final thickness in the range of between about 100 and 1000 Å. The silicon oxide top insulation layer 20 is preferably composed of a silicon oxide such as TEOS, BPSG, and PSG; and is preferably composed of borophosphosilicate glass.

Referring to FIGS. 3A–3C, the top isolation layer is preferably formed as follows. As shown in FIG. 3A, a conformal oxide layer 20B, preferably an oxide formed using TEOS, is formed over the substrate surface. Next a planarization layer 20A is formed over the substrate surface. The planarization layer 20A is preferably formed of borophosphosilicate glass and preferably has a thickness in the range of between about 1000 and 5500 Å. A borophosphosilicate glass (BPSG) layer can be formed by low pressure chemical vapor deposition (LPCVD) using tetraethylorthosilicate (TEOS) as a reactant. Boron and phosphorus are added to the ambient during the formation of the borophosphosilicate glass layer. The layer is thermally treated at a temperature of 850° C. for 30 minutes to cause flow and planarization. The BPSG layer is preferably etched back to remove between about 3500 and 4500 Å of the BPSG layer.

Referring to FIG. 3B, the planarization layer 20A and conformal oxide layer 20B are etched back. Next, a mask is formed over the gate electrodes and conductive structures. As shown in FIG. 3C, the planarization layer 20A and conformal oxide layer 20B are etched thereby forming the top isolation layers 20 over the gate electrodes. Also, a thickness of the top isolation layer 20 may be left on top to the conductive structures. The oxide cap layer 20 is important since it planarizes the underlying layers and improves a subsequent polysilicon etch.

Figure 4:
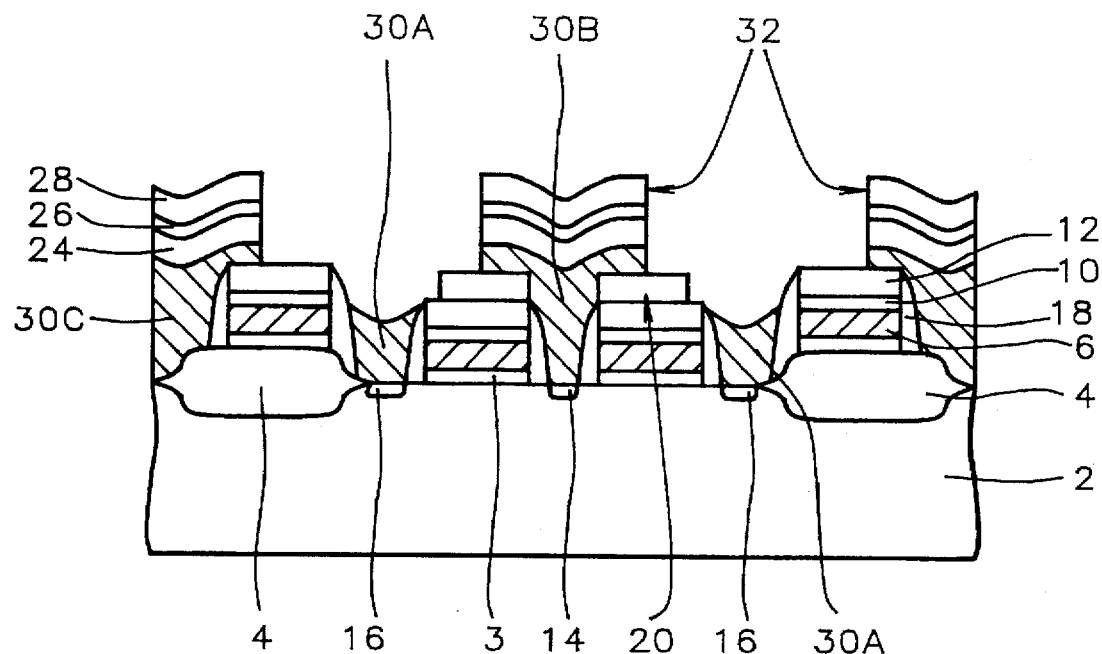

As shown in FIG. 4, the following layers are formed sequentially over the resulting surface: a first polysilicon layer 22, a dielectric layer 26, and a second isolation cap layer 28.

The first polysilicon layer 22 preferably has a thickness (after the optional etch back if used) in the range of between about 1000 and 6000 Å and more preferably about 1500 Å.

The dielectric layer 26 preferably has a thickness in the range of between about 500 and 2000 Å and more preferably about 1000 Å and can be formed by a TEOS oxide process, such as by reacting tetraethylorthosilicate at 650° to 750° C. in a low pressure chemical vapor deposition reactor and depositing silicon oxide.

The second isolation cap layer 28 is preferably formed of silicon nitride, or silicon oxide. The second isolation cap layer 28 is preferably formed of silicon nitride having an anti-reflective coating (ACR) formed by a LPCVD ARC process (as described above) by reacting an excess of dichlorosilane with ammonia and the first isolation layer has a thickness in the range of between about 600 and 1800 Å and an extinction coefficient (k) in range of about 0.3 to 0.5.

As shown in FIG. 4, the second isolation cap layer 28, the dielectric layer 26 are masked are selectively etched, at least over the source 16. Also, upper portions of the first polysilicon layer 22 over the source 16 are etched forming a bottom node plug 30B contacting the drain 14. This etching forms a first opening 32 (e.g., interconnect opening) having first sidewalls. Polysilicon regions 30C are formed over the field oxide regions 04.

The second isolation cap layer 28 is etched using the same highly selective etch used to etch the first isolation cap layer and is describe above. Again, the selective etch allows smaller interconnects to be defined than the conventional silicon nitride process allows.

The dielectric layer 26 is etched using a conventional etch which has a high selectivity to polysilicon. The upper portion of the first polysilicon layer over the source 16 is then etched. This forms the bottom plug 30A over the sources 16. The bottom plug 30A has thickness in the range of between about 0 and 7000 Å and more preferably about 3000 Å.

Figure 5:
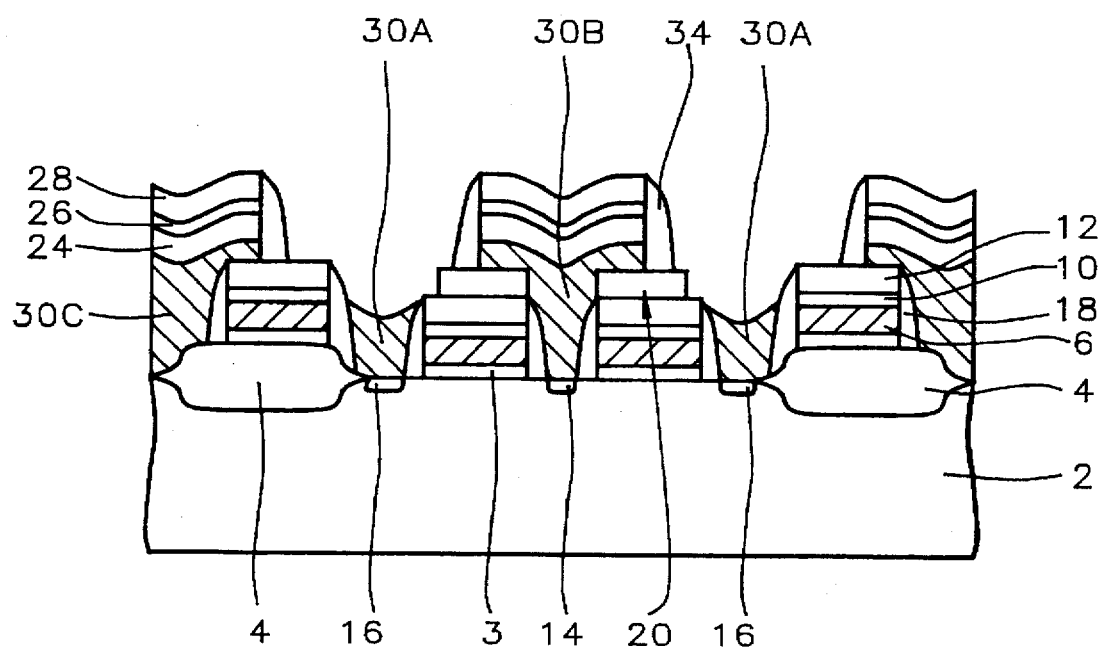

As shown in FIG. 5, second isolation spacers 34 are formed on the first sidewalls of the first opening 32. To form the second isolation spacers 34, a second isolation layer (not shown) is formed over the resulting surface and then anisotrophically etched. The second isolation spacers are preferably formed of silicon oxide formed by a TEOS process. The first isolation layer has a thickness in the range of between about 200 and 1500 Å and more preferably about 1000 Å.

Figure 6:
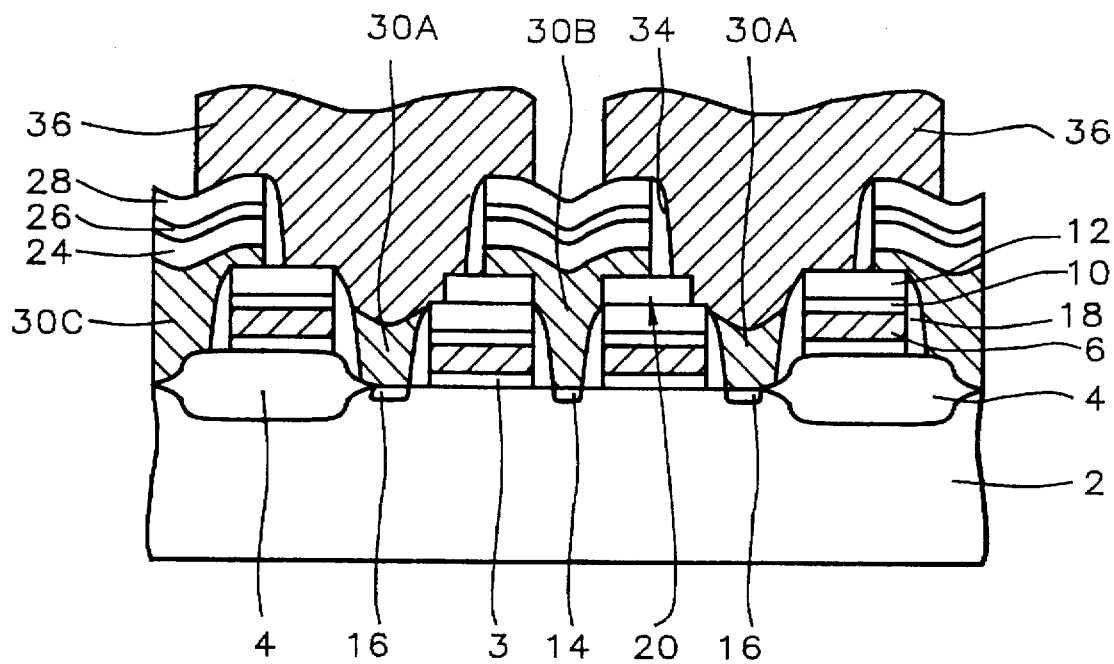

As FIG. 6 shows, a top node plug 36 is formed filling the first opening 32 and forming a contact to the bottom node plug 30A thereby forming a storage electrode 30A 36. The top node plug 36 preferably has a thickness in the range of between about 2000 and 10,000 Å and more preferably about 7000 Å. The top node plug is formed of a doped polysilicon or a polycide such as WSi. The top node plug has an impurity concentration in the range of between about 1E19 and 1E22 atoms/cm³.

Figure 7:
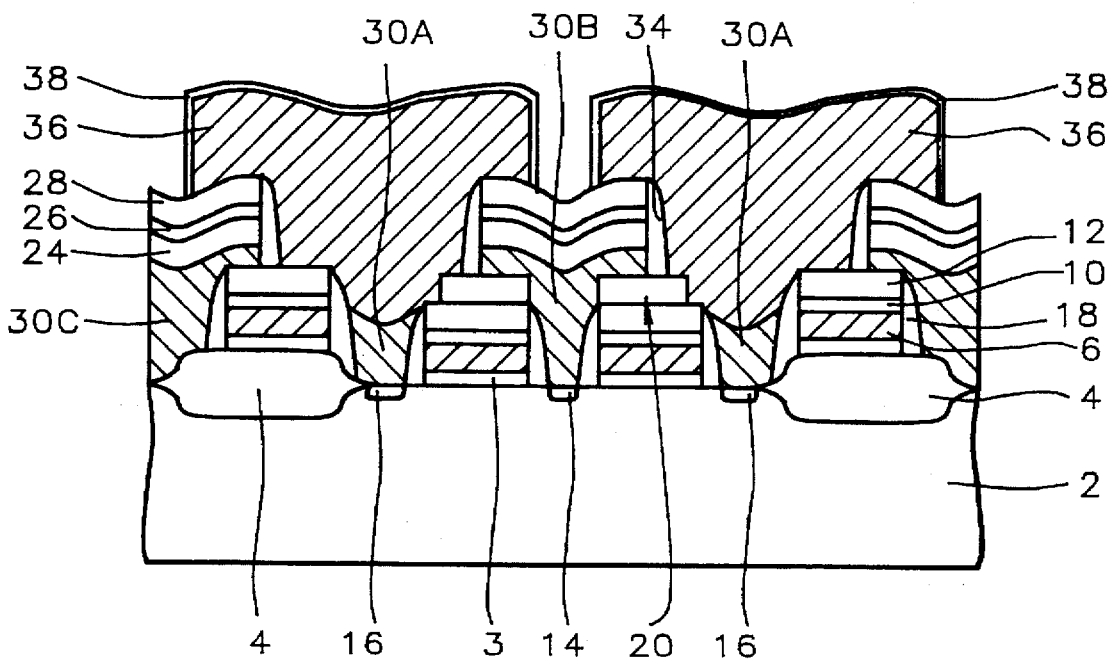

As shown in FIG. 7, a capacitor dielectric layer 38 is formed over the storage electrode 28. The material of the dielectric layer 38 can be any suitable material having a high dielectric constant and being continuous and pinhole free. The conformal dielectric layer 38 is preferably formed of silicon nitride, an oxide/nitride/oxide (ONO) film, tantalum pentoxide ($Ta_2O_5$), or silicon oxide material. Preferably, the conformal dielectric layer is formed of ONO. The conformal dielectric layer 38 preferably has a thickness in the range between about 30 and 100 Å and more preferably about 55 Å. A direct blanket etch back process is preferably used to etch the capacitor dielectric between adjacent electrodes 36.

Figure 8:
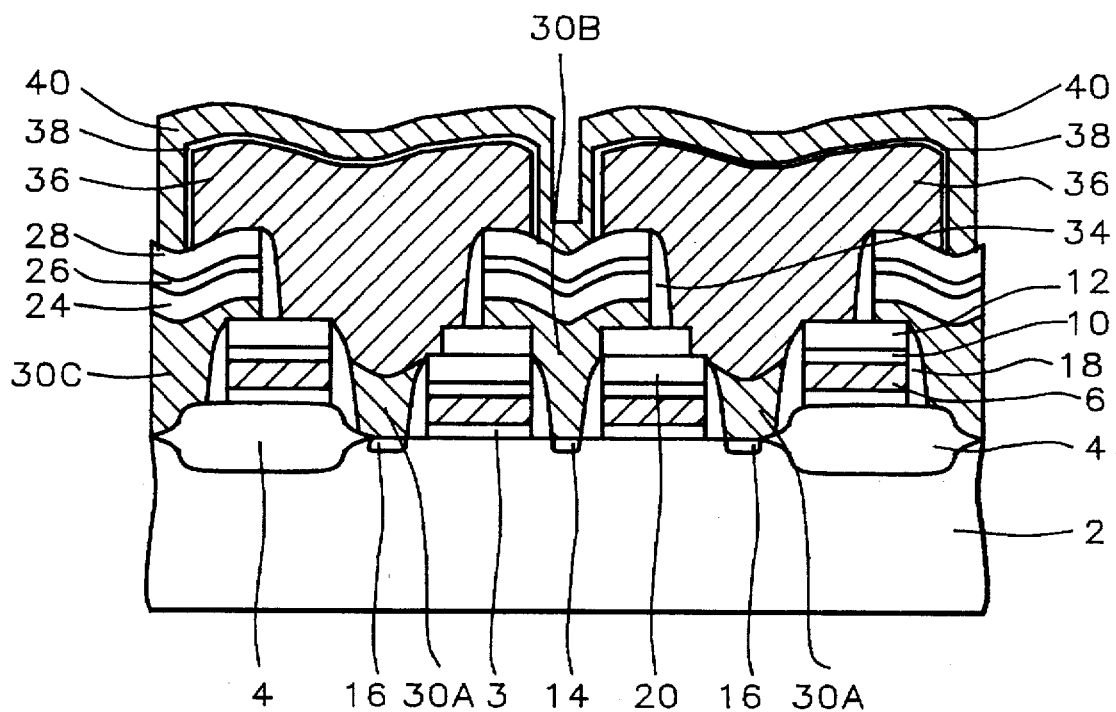
Figure 9:
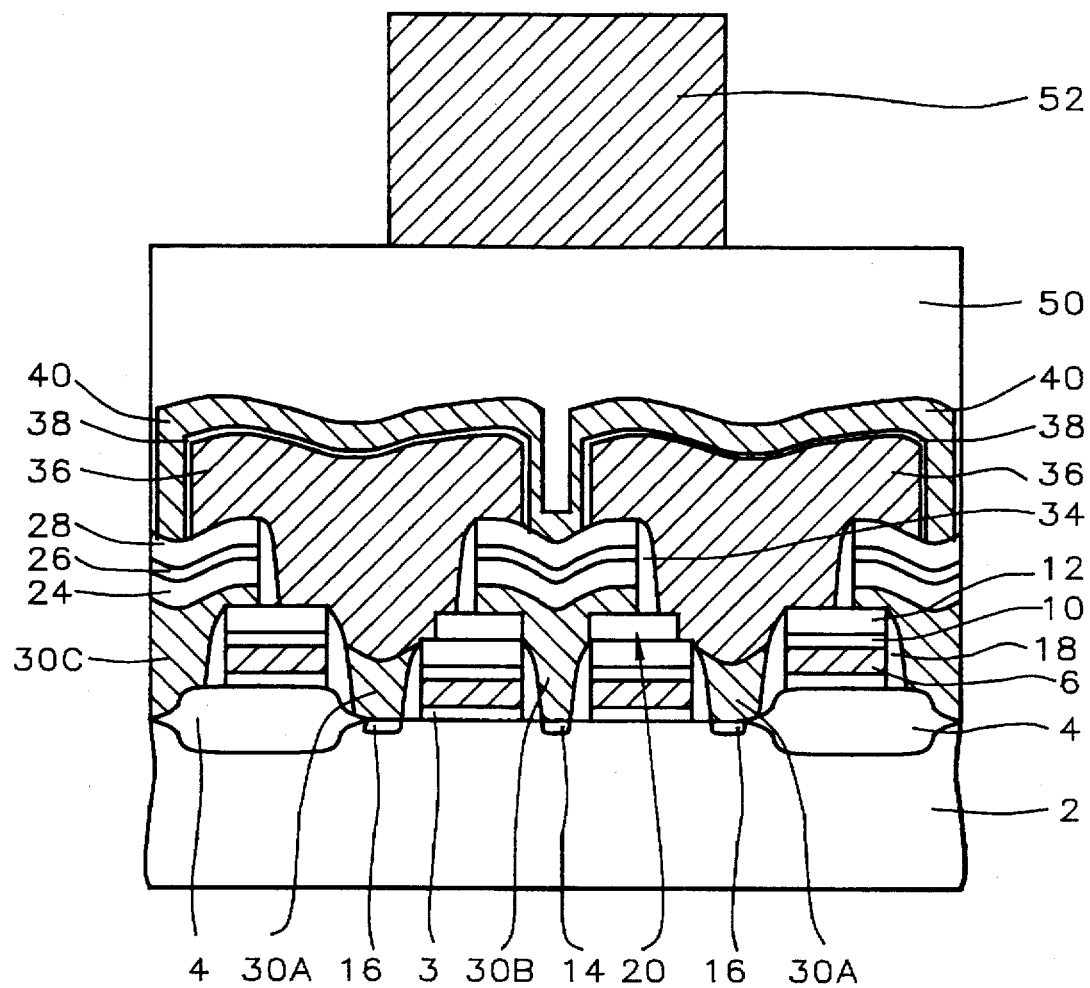

A top electrode 40 is then formed over the dielectric layer 38 by the processes as shown in FIG. 8. This is accomplished by forming a doped conductive layer over the substrate surface. A polysilicon layer can be formed and doped in situ or alternately ion implanted with impurities to obtain the proper doping level. The top electrode 40 preferably has a thickness in the range between about 500 and 2000 Å. and more preferably about 1000 Å. The top plate electrode 40 is preferably formed of polycrystalline silicon doped with an impurity. The top plate electrode/conductive layer can have an impurity concentration in the range of between about 1E19 and 1E22 atoms/cm$^3$ and more preferably about 1E21 atoms/cm$^3$. The DRAM cell is completed by forming a top insulation layer 50 and a metal layer 52 over the top electrode as shown in FIG. 9.

The present invention provides a novel method of forming an interconnect and a miniaturized memory cell which has numerous advantages over the prior art. First, the inventive self-aligning process uses the two sets of spacers 18 34 that allow a wide processing window for contact etching to form the contact hole 32. Also, the isolation spacers permit a small contact hole aspect ratio. With the invention, contact hole are self formed and self aligned without additional photo masks and planarizing layers. By eliminating planarized oxide layers, a small aspect ratio can be achieved. The special first and second isolation cap layers 12 28 are composed of an anti-reflective coating (ARC) which improves the lithographic performance by permitting finer contact hole definition. Thirdly, the method reduces the masking steps by defining both the source and drain contacts 30A 36 30B in the same three masking steps. Lastly, the highly selective silicon nitride etch process improves the accuracy of the contact hole and storage electrode. Furthermore, the isolation top layer 20 contributes to the smooth topology of the resultant surface which provides a smoother surface for subsequent overlying layers thereby improving yields.

While the invention has been particularly shown and described with reference to the preferred embodiments thereof, it will be understood by those skilled in the art that various changes in form and details may be made without departing from the spirit and scope of the invention.

What is claimed is:

1. A method of fabricating an interconnect on a semiconductor substrate having a device area and spaced isolation regions formed therein; comprising the steps of:

a) providing spaced gate electrodes on said device area and conductive structures on said isolation regions; said gate electrodes and conductive structures having a top surface formed of a first isolation cap layer composed of an anti reflective silicon nitride film; said gate electrodes and conductive structures having sidewalls;

b) forming first isolation spacers composed of silicon nitride on the sidewalls of said gate electrodes and on the sidewalls of said conductive structures;

c) forming a top isolation layer covering said first isolation cap layer over said gate electrodes;

d) forming sequentially a first polysilicon layer, a dielectric layer, and a second isolation cap layer, over the substrate surface;

e) forming a first opening having first sidewalls by masking and selectively etching said second isolation layer and said dielectric layer between said gate electrode and said conductive structure; and etching upper portions of said first polysilicon layer between said gate electrode and said conductive structure thereby forming a bottom node plug;

f) forming second isolation spacers on said first sidewalls of said first opening; and g) forming a top node plug filling said first opening and forming a contact to said bottom node plug thereby forming said interconnect to said substrate.

2. The method of claim 1 which further includes forming a capacitor dielectric layer and a top electrode layer over said interconnect thereby forming a capacitor and completing a memory cell.

3. The method of claim 1 wherein said gate electrode and said conductive structure comprise: (1) a gate oxide layer, (2) a conductive layer, (3) a gate insulation layer, and (4) a first isolation cap layer; said first isolation cap layer is formed of silicon nitride having an anti-reflective coating formed by a low pressure chemical vapor deposition (LPCVD) process by reacting an excess of dichlorosilane with ammonia with a ratio in the range of between about 2.0 and 4.0, and at a pressure in the range of between about 100 and 500 mTorr, and at a temperature in the range of between about 750° and 850° C., and said first isolation cap layer having a thickness in the range of between about 200 and 2000 Å and an extinction coefficient (k) in range of 0.3 to 0.5.

4. The method of claim 1 wherein said first isolation cap layer is formed of a silicon oxide layer over a silicon nitride layer; and said silicon nitride layer having a thickness in the range of between about 400 and 2000 Å and the silicon oxide layer has a thickness in the range of between about 200 and 1000 Å.

5. The method of claim 1 wherein said first isolation spacers are formed of silicon nitride and have a thickness in the range of between about 200 and 2000 Å.

6. The method of claim 1 wherein the distance between said gate electrodes is in the range of between about 0.25 and 0.4 μm and the distance between said first isolation spacers in the range of between about 0.2 and 0.35 μm.

7. The method of claim 1 wherein said top isolation layer has a thickness in the range of between about 1000 and 5500 Åand is composed of borophosphosilicate glass.

8. The method of claim 1 wherein said first polysilicon layer has a thickness in the range of between about 1000 and 6000 Å.

9. The method of claim 1 wherein said dielectric layer has a thickness in the range of between about 500 and 2000 and is formed of silicon oxide.

10. The method of claim 1 wherein said second isolation cap layer is formed of silicon nitride having an anti-reflective coating formed by a LPCVD process by reacting an excess of dichlorosilane with ammonia and the first isolation layer has a thickness in the range of between about 600 and 1800 Å. and an extinction coefficient (k) in range of about 0.3 to 0.5.

11. The method of claim 1 wherein said selective etching used to etch said second isolation cap layer is a highly selective silicon nitride etch; said highly selective etch having a main etch step and an over etch step;

said main etch step performed with a pressure in the range of between about 280 and 320 mtorr and a power in the range of between about 250 and 300 watts, and a gap in the range of between about 0.7 and 0.9 cm, and a SF$_6$ flow in the range of between about 60 and 80 sccm, and a CHF$_3$ flow in the range of between about 9 and 11 sccm, and a He flow in the range of between about 240 and 260 sccm; and said over etch step performed with a pressure in the range of between about 725 and 775 mtorr and a power in the range of between about 180 and 200 watts, and a gap in the range of between about 0.9 and 1.1 cm, and a SF$_6$ flow in the range of between about 110 and 130 sccm, and a CHF$_3$ flow in the range of between about 9 and 11 sccm, and a He flow in the range of between about 18 and 22 sccm.

12. The method of claim 1 wherein said second isolation spacers are formed of borophosphosilicate glass.

13. A method of fabricating a capacitor on a semiconductor substrate having a device area and spaced isolation regions formed therein; comprising the steps of:
   a) forming a gate oxide layer over said substrate and said isolation regions;
   b) forming a first conductive layer over said gate oxide layer;
   c) forming a gate dielectric layer over said first conductive layer;
   d) forming a first isolation cap layer over said gate dielectric layer; said first isolation cap layer formed of anti-reflective silicon nitride;
   e) patterning said gate oxide layer, said first conductive layer, gate dielectric layer, and said first isolation cap layer to form spaced gate electrodes over said device area and conductive structures over said isolation regions;
   f) forming first isolation spacers on the sidewalls of said gate electrodes and on the sidewalls of said conductive structures; said first isolation spacers formed of silicon nitride;
   g) implanting impurity ions into said substrate surface using said gate electrodes and said isolation spacers as a mask forming sources and drains;
   h) forming a top isolation layer covering the first isolation cap layer over said gate electrodes; said top isolation layer composed of silicon oxide;
   i) forming sequentially a first polysilicon layer, a dielectric layer, and a second isolation cap layer over the resulting structure; said second isolation cap layer composed of anti reflective silicon nitride;
   j) forming a first opening having first sidewalls by masking and selectively etching said second isolation cap layer and said dielectric layer over said source; and etching upper portions of said first polysilicon layer over said source forming a bottom node plug; and forming a drain contact to said drain,
   k) forming second isolation spacers on said first sidewalls of said first opening; said second isolation spacers formed of silicon oxide; and
   l) forming a top node plug filling said first opening and forming an electrical contact to said bottom node plug thereby forming a interconnect to said source; and
   m) forming a capacitor dielectric layer and a top electrode layer over said interconnect thereby forming a capacitor and completing a memory cell.

14. The method of claim 13 wherein said first isolation cap layer is formed of antireflective silicon nitride formed by a low pressure chemical vapor deposition (LPCVD) process by reacting an excess of dichlorosilane with ammonia with a ratio in the range of between about 2 and 4 and at a pressure in the range of between about 100 and 500 mTorr and at a temperature in the range of between about 750° and 850° C., and said first isolation cap layer has a thickness in the range of between about 200 and 2000 Å and an extinction coefficient (k) in range of 0.3 to 0.5.

15. The method of claim 13 wherein said first isolation spacers are formed of silicon nitride and have a thickness in the range of between about 200 and 2000 Å.

16. The method of claim 13 wherein said top isolation layer has a thickness in the range of between about 1000 and 5500 Å and is composed of borophosphosilicate glass.

17. The method of claim 13 wherein said dielectric layer has a thickness in the range of between about 500 and 2000 and is formed by a silicon oxide using a LPCVD process with Tetraethylorthosilicate (TEOS).

18. The method of claim 13 wherein said second isolation cap layer is formed of silicon nitride having an anti-reflective coating formed by a LPCVD process by reacting an excess of dichlorosilane with ammonia and the first isolation layer has a thickness in the range of between about 600 and 1800 Å and an extinction coefficient (k) in range of 0.3 to 0.5.

19. The method of claim 13 wherein said selective etching used to etch said second isolation cap layer is a highly selective silicon nitride etch; said highly selective etch having a main etch step and an over etch step; said main etch performed with a pressure in the range of between about 280 and 320 mtorr and a power in the range of between about 250 and 300 watts, and a gap in the range of between about 0.7 and 0.9 cm, and a $SF_6$ flow in the range of between about 60 and 80 sccm, and a $CHF_3$ flow in the range of between about 9 and 11 sccm, and a He flow in the range of between about 240 and 260 sccm; said over etch step performed with a pressure in the range of between about 725 and 775 mtorr and a power in the range of between about 180 and 200 watts, and a gap in the range of between about 0.9 and 1.1 cm, and a $SF_6$ flow in the range of between about 110 and 130 sccm, and a $CHF_3$ flow in the range of between about 9 and 11 sccm, and a He flow in the range of between about 18 and 22 sccm.

20. A method of fabricating an interconnect on a semiconductor substrate having a device area and spaced isolation regions formed therein; comprising the steps of:
   a) forming a gate oxide layer over said substrate and said isolation regions;
   b) forming a first conductive layer over said gate oxide layer;
   c) forming a gate dielectric layer over said first conductive layer; said gate dielectric layer composed of silicon oxide;
   d) forming a first isolation cap layer over said gate dielectric layer; said first isolation cap layer formed of an anti-reflective silicon nitride coating;
   e) patterning said gate oxide layer, said first conductive layer, gate dielectric layer, and said first isolation cap layer to form spaced gate electrodes over said device area and conductive structures over said isolation regions;
   f) forming first isolation spacers composed of silicon nitride on the sidewalls of said gate electrodes and on the sidewalls of said conductive structures by forming a first isolation layer over the substrate surface and anisotrophically etching said first isolation layer using a highly selective silicon nitride etch; said highly selective etch having a main etch step and a over etch step; said main etch step performed with a pressure in the range of between about 280 and 320 mtorr and a power in the range of between about 250 and 300 watts, and a gap in the range of between about 0.7 and 0.9 cm, and a $SF_6$ flow in the range of between about 60 and 80 sccm, and a $CHF_3$ flow in the range of between about 9 and 11 sccm, and a He flow in the range of between about 240 and 260 sccm; said over etch step performed with a pressure in the range of between about 725 and 775 mtorr and a power in the range of between about 180 and 200 watts, and a gap in the range of between about 0.9 and 1.1 cm, and a $SF_6$ flow in the range of between about 110 and 130 sccm, and a $CHF_3$ flow in the range of between about 9 and 11 sccm, and a He flow in the range of between about 18 and 22 sccm;

g) implanting impurity ions into said substrate surface using said gate electrodes and said isolation spacers as a mask forming highly doped sources and drains;

h) forming a top isolation layer covering the first isolation cap layer over said gate electrodes; said top isolation layer formed of silicon oxide;

i) forming sequentially a first polysilicon layer, a dielectric layer, and a second isolation cap layer, over the resulting structure; said second isolation cap layer formed of an anti-reflective silicon nitride coating;

j) forming a first opening having first sidewalls by masking and selectively etching said second isolation cap layer and said dielectric layer, over said source; and etching upper portion of said first polysilicon layer over said source forming a bottom node plug; and forming a drain contact to said highly doped drain, k) forming second isolation spacers on said first sidewalls of said first opening; said second isolation spacers formed of borophosphosilicate glass; and l) forming a top node plug filling said first opening and forming a contact to said bottom node plug thereby forming a interconnect to said source.

21. The method of claim 20 which further includes forming a capacitor dielectric layer and a top electrode layer over said interconnect thereby forming a capacitor and completing a memory cell.

22. The method of claim 20 wherein said first isolation cap layer and second isolation cap layer are formed of silicon nitride having an anti-reflective coating formed by a LPCVD process by reacting an excess of dichlorosilane with ammonia with a ratio in the range of between about 2 and 4 and at a pressure in the range of between about 100 and 500 mTorr and at a temperature in the range of between about 750° and 850° C., and said first isolation cap layer has a thickness in the range of between about 200 and 2000 Å. and an extinction coefficient (k) in range of 0.3 to 0.5.

23. The method of claim 20 wherein the distance between said gate electrodes is in the range of between about 0.25 and 0.4 μm and the distance between said first isolation spacers in the range of between about 0.2 and 0.35 μm.

24. The method of claim 20 wherein said top isolation layer has a thickness in the range of between about 1000 and 5500 Å and is composed of borophosphosilicate glass.

* * * * *